United States Patent
Asano et al.

(10) Patent No.: US 9,064,867 B2
(45) Date of Patent: Jun. 23, 2015

(54) SEMICONDUCTOR DEVICE AND METHOD FOR MANUFACTURING SAME

(75) Inventors: Norihisa Asano, Osaka (JP); Kazuyoshi Imae, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 217 days.

(21) Appl. No.: 13/704,396

(22) PCT Filed: Apr. 20, 2011

(86) PCT No.: PCT/JP2011/059735
§ 371 (c)(1),
(2), (4) Date: Dec. 14, 2012

(87) PCT Pub. No.: WO2011/162018
PCT Pub. Date: Dec. 29, 2011

(65) Prior Publication Data
US 2013/0087924 A1  Apr. 11, 2013

(30) Foreign Application Priority Data

Jun. 23, 2010  (JP) .................... 2010-142233

(51) Int. Cl.

| H01L 23/48 | (2006.01) |
| H01L 23/522 | (2006.01) |
| G02F 1/1368 | (2006.01) |
| H01L 27/12 | (2006.01) |
| H01L 29/786 | (2006.01) |
| H01L 21/768 | (2006.01) |

(52) U.S. Cl.
CPC ............ *H01L 23/522* (2013.01); *G02F 1/1368* (2013.01); *H01L 27/12* (2013.01); *H01L 29/78606* (2013.01); *H01L 21/76838* (2013.01); *H01L 27/124* (2013.01); *H01L 27/1248* (2013.01); *H01L 2924/0002* (2013.01)

(58) Field of Classification Search
CPC .............. H01L 27/124; H01L 27/1248; H01L 29/78606; G02F 1/1368
USPC ........................................................ 257/773
See application file for complete search history.

(56) References Cited

U.S. PATENT DOCUMENTS 5,523,625 A   6/1996  Hayashi

FOREIGN PATENT DOCUMENTS

| JP | 54-134583 A | 10/1979 |
| JP | H07-122632 A | 5/1995 |

*Primary Examiner* — Long K Tran
(74) *Attorney, Agent, or Firm* — Chen Yoshimura LLP

(57) ABSTRACT

Disclosed is a semiconductor device provided with: lower-layer wiring formed on a substrate, an interlayer insulating film covering the lower-layer wiring, and a first upper-layer wiring line (18b) and a second upper-layer wiring line (18c) arranged on the interlayer insulating film and intersecting with the lower-layer wiring, and a level-difference adjustment protrusion is provided between the first upper-layer wiring line (18b) and the second upper-layer wiring line (18c) adjacent to a side section of the lower-layer wiring.

2 Claims, 10 Drawing Sheets

SEMICONDUCTOR DEVICE AND METHOD FOR MANUFACTURING SAME

TECHNICAL FIELD

The present invention relates to a semiconductor device and a method of manufacturing the same, and more particularly, to a semiconductor device suitable for a liquid crystal display device provided with driver circuits that are constituted of thin-film transistors and a method of manufacturing the same.

BACKGROUND ART

In recent years, a multilayer wiring structure has been more widely adopted for a semiconductor device as the size of the semiconductor device is increasingly reduced. As shown in a plan view in FIG. 10 and a cross-sectional view in FIG. 11 along the line A-A in FIG. 10, the multilayer wiring structure has a lower-layer wiring line 33 insulated by interlayer insulating films 32 and 34 on a substrate 31. Above the lower-layer wiring line 33, upper-layer wiring lines 35 are disposed so as to intersect with the lower-layer wiring line 33. With such a multilayer wiring structure, a layout design can be made easier and an area for chips can be smaller, but because the upper-layer wiring lines 35 are disposed so as to cross over a level difference section made by the lower-layer wiring line 33, a problem of a short circuit between the upper-layer wiring lines 35 occurs. In particular, when the upper-layer wiring lines 35 are arranged so as to intersect with the level difference section made by the lower-layer wiring lines 33 with narrow intervals, the wiring lines become more susceptible to a short circuit.

This problem is caused by anisotropic dry etching that is employed in a recent wiring forming process. Although the anisotropic dry etching makes it possible to form the wiring lines precisely according to a resist pattern, when the thickness of a metal film used to form the upper-layer wiring lines is increased due to a large level difference, a part of the metal film is not removed in the etching, and is left as an etching residue. The smaller the inter-wiring space becomes, the more likely this problem is to occur.

In a conventional multilayer wiring structure, for example, when the upper-layer wiring lines 35 are disposed so as to cross over the level difference section made by the lower-layer wiring line 33, an etching residue 36 of the upper-layer wiring lines 35 would be left along the level difference section on the lower-layer wiring line 33. When the etching residue 36 is connected between the respective upper-layer wiring lines 35, the short circuit occurs.

In order to solve the short-circuit problem caused by the etching residue 36, as shown in FIG. 12, Patent Document 1 describes a configuration in which a protruding portion 37 that has a shape similar to the first wiring line is provided between a plurality of second wiring lines 35 that are disposed over a level difference section made by the first wiring line 33. With this configuration, the level difference section above the first wiring line 33 can be made longer, and the possibility that the etching residue of the second wiring lines 35 are connected, resulting in a short circuit, can be reduced, thereby achieving an effective semiconductor device.

RELATED ART DOCUMENT

Patent Document

Patent Document 1: Japanese Patent Application Laid-Open Publication No. H7-122632 (published on May 12, 1995)

SUMMARY OF THE INVENTION

Problems to be Solved by the Invention

However, with the technique described in Patent Document 1, although the possibility of the short circuit between the second wiring lines 35 was reduced, it was not possible to reliably prevent the short circuit between the second wiring lines 35 because the etching residue still remained on the level difference section.

The present invention aims at providing a semiconductor device having a multilayer wiring structure that can reliably prevent a short circuit caused by etching residue formed on a lower part of a level difference section, and more particularly, aims at providing a semiconductor device that can improve manufacturing yield of a liquid crystal display device and a method of manufacturing the same.

Means for Solving the Problems

A semiconductor device and a method of manufacturing the same of the present invention relate to a semiconductor device that is provided with: a lower-layer wiring line formed on a substrate; an interlayer insulating film covering the lower-layer wiring line; a first upper-layer wiring line and a second upper-layer wiring line arranged on the interlayer insulating film so as to intersect with the lower-layer wiring line; and a level-difference adjustment island disposed between the first upper-layer wiring line and the second upper-layer wiring line adjacent to a side of the lower-layer wiring line.

With the above configuration, intermediate steps, which are staircase-like, individually separated smaller steps, are made in the level difference section on the interlayer insulating layer. The intermediate steps make it difficult for etching residue to be left at the level difference section upon forming the upper-layer wiring lines over the gate wiring line. Therefore, it becomes possible to prevent the first upper-layer wiring line and the second upper-layer wiring line from being short-circuited at the level difference section.

The level-difference adjustment island can be formed of an interlayer film such as an insulator, a semiconductor film, and a conductive material film disposed between the substrate and the lower-layer wiring line. This way, the level-difference adjustment island can be formed without increasing a number of process steps.

Effects of the Invention

According to the present invention, a short circuit caused by etching residue that is formed on a lower part of a level difference section can be reliably prevented, and manufacturing yield of a semiconductor device having a multilayer wiring structure can be improved.

DETAILED DESCRIPTION OF EMBODIMENTS

Preferred embodiments of a semiconductor device of the present invention will be described below with reference to figures.

Embodiment 1

Figure 1:
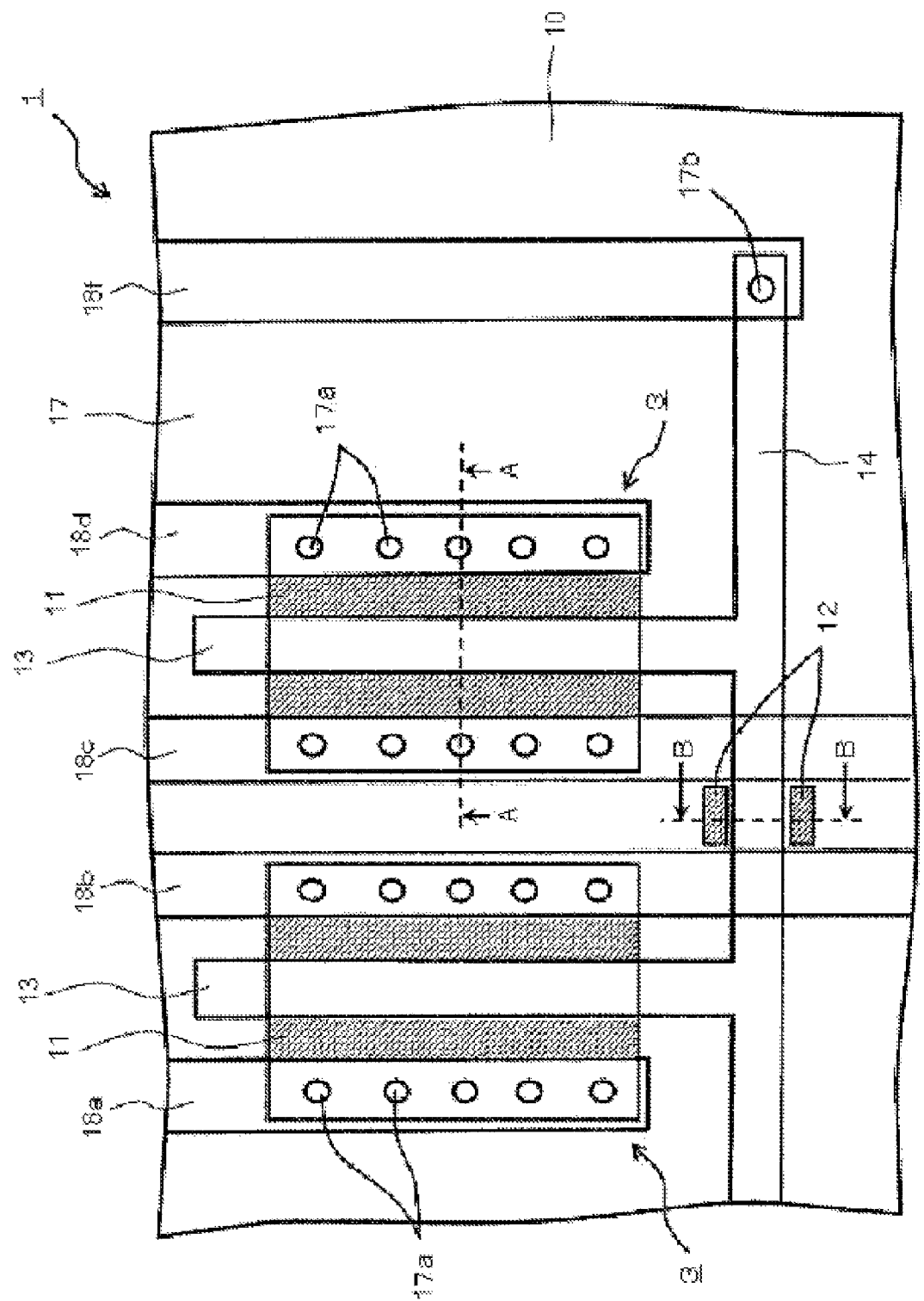
FIG. 1 is a plan view showing a first semiconductor device of the present invention.

FIG. 1 is a top view showing part of a driver circuit in a liquid crystal display device 1 of Embodiment 1. In Embodiment 1, top-gate TFTs 3 are used for the driver circuit.

As shown in FIG. 1, in the driver circuit of the liquid crystal display device 1, active layers 11 of the TFTs 3 are selectively formed on a transparent substrate 10. The respective active layers 11 are covered by an interlayer insulating film (not shown). On this interlayer insulating film, gate electrodes 13 of the TFTs 3 and gate wiring lines 14, which are lower-layer wiring lines, are formed. Each gate electrode 13 is disposed so as to cross over the active layer 11, forming a top-gate TFT 3. Also, the gate electrodes 13 are connected to the gate wiring lines 14. Because this gate wiring lines 14 are disposed in a lower layer in the liquid crystal display device 1, the gate wiring lines 14 are also referred to as lower-layer wiring lines in the present invention.

On the gate electrodes 13 and the gate wiring lines 14, an interlayer insulating film 17 is formed. On the interlayer insulating film 17, upper-layer wiring lines 18a to 18f are formed. The upper-layer wiring lines 18a to 18d are connected to sources and drains of the respective semiconductor layers 11 through contact holes 17a formed in the interlayer insulating film 17. The upper-layer wiring line 18f is connected to the gate wiring line 14 through a contact hole 17b.

In the present invention, in a plan view in FIG. 1, level-difference adjustment protrusions 12 are provided between the first upper-layer wiring line 18b and the second upper-layer wiring line 18c that are the upper-layer wiring lines out of the upper-layer wiring lines 18a to 18f and that are arranged so as to intersect with the gate wiring line 14, i.e., the lower-layer wiring line. The level-difference adjustment protrusions 12 are disposed on both sides of the gate wiring line 14 adjacent to, but not overlapping the gate wiring line 14.

As described in detailed later, by providing the level-difference adjustment protrusions 12 on both sides of the gate wiring line 14, intermediate steps that can make the level differences caused by the gate wiring line 14 relatively smaller are formed adjacent to each other, which causes smaller, individually separated steps to be formed on the interlayer insulating film 17 in a staircase-like pattern. This way, when the upper-layer wiring lines 18 are formed so as to cross the gate wiring line 14, etching residue is less likely to be formed at the level difference section. Therefore, it is possible to prevent the first upper-layer wiring line 18b and the second upper-layer wiring line 18c from being short-circuited at the level difference section.

The level-difference adjustment protrusions 12 can be formed of an interlayer film such as an insulating film, a semiconductor film, and a conductive material film disposed between the substrate and the lower-layer wiring line. This way, in a process of manufacturing the top-gate TFT, the level-difference adjustment protrusions 12 can be formed without increasing a number of process steps.

Figure 2:
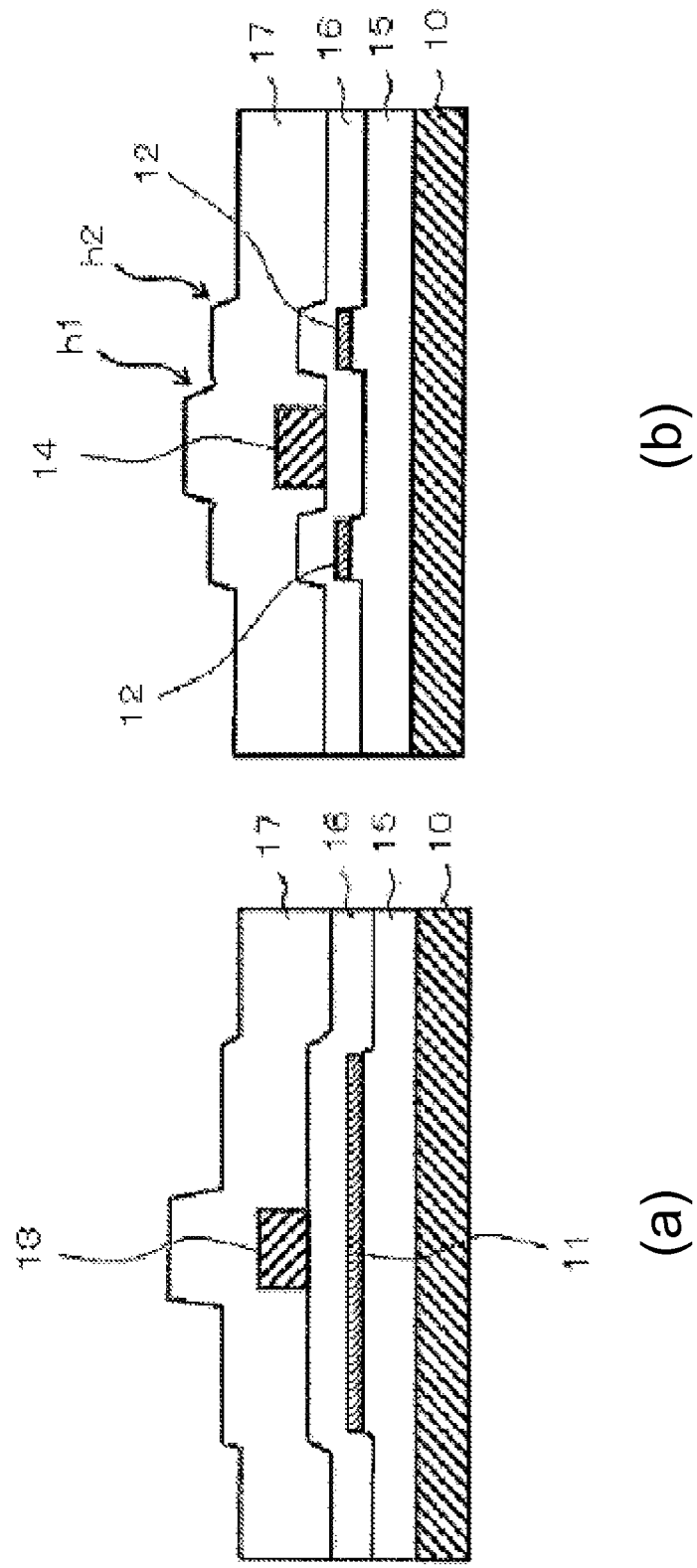
FIG. 2 is a first cross-sectional view showing a method of manufacturing the first semiconductor device.
Figure 3:
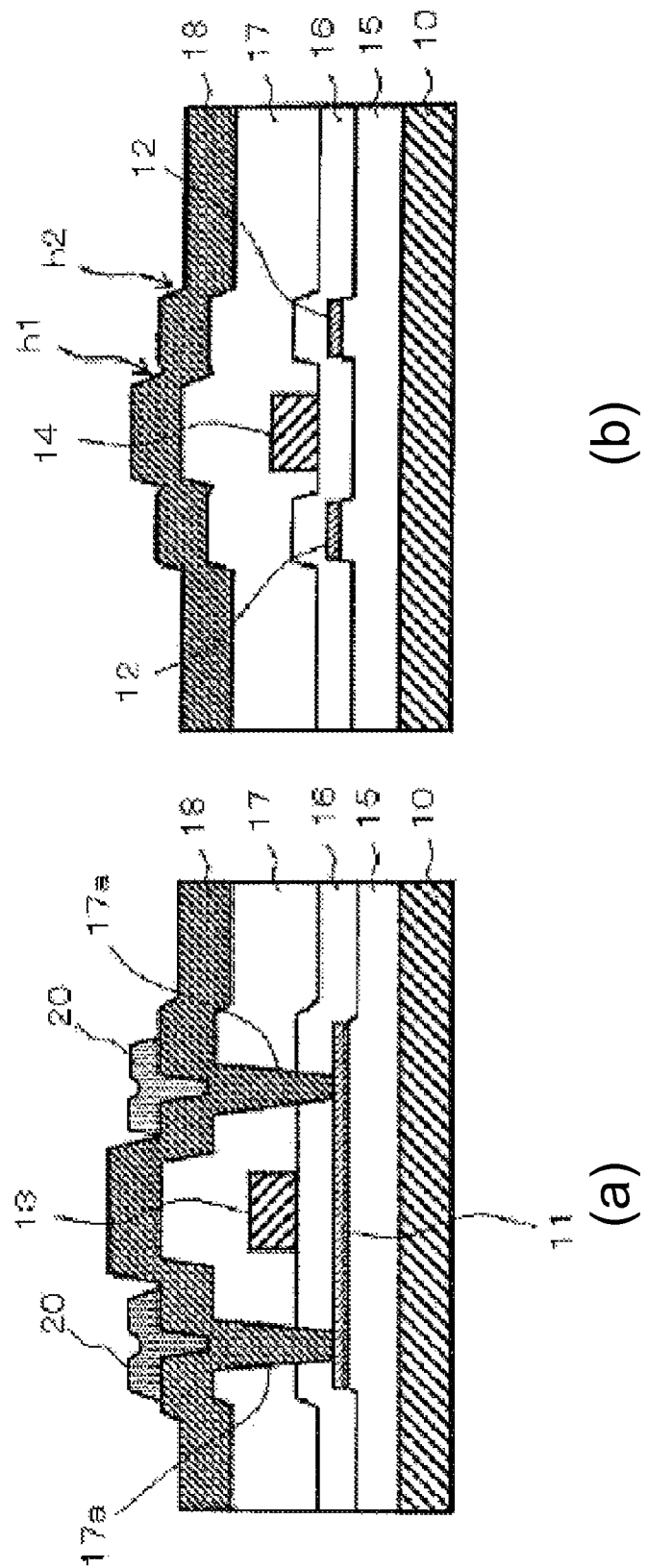
FIG. 3 is a second cross-sectional view showing the method of manufacturing the first semiconductor device.
Figure 4:
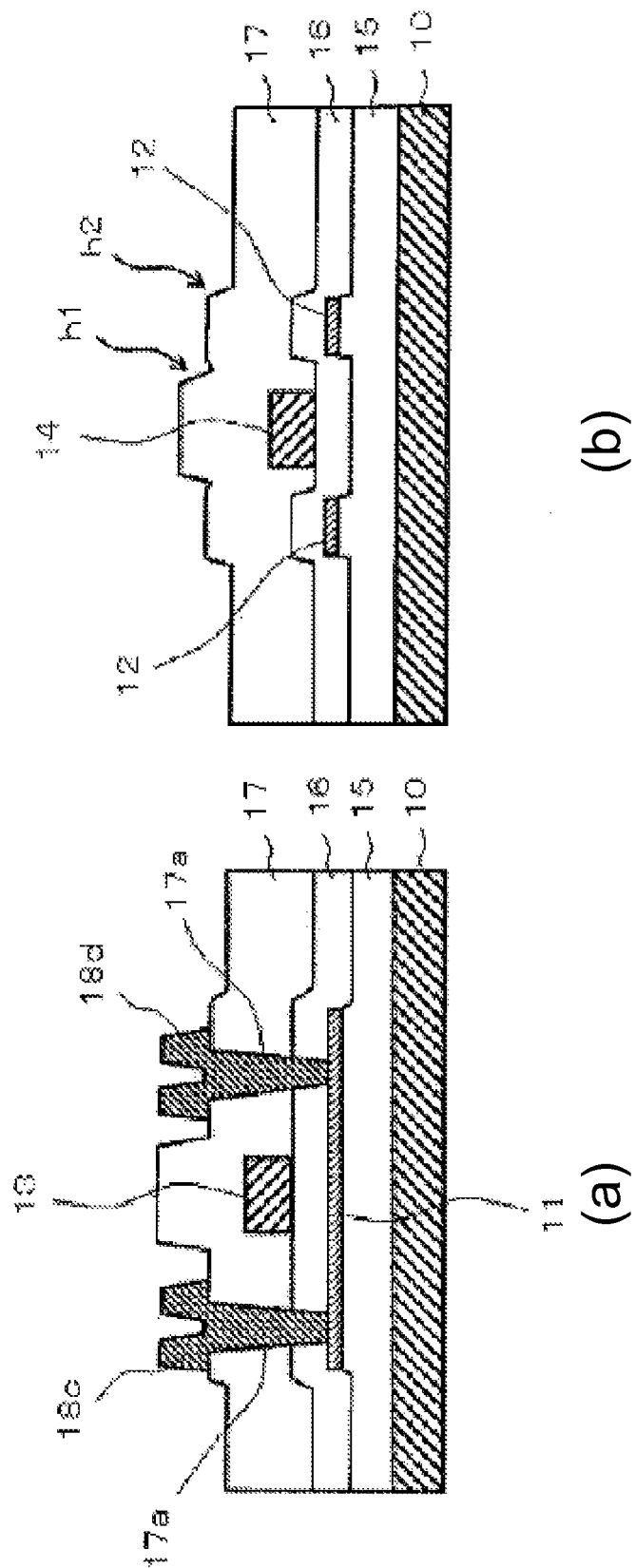
FIG. 4 is a third cross-sectional view showing the method of manufacturing the first semiconductor device.

FIGS. 2 to 4 are cross-sectional views respectively showing a method of manufacturing the liquid crystal display device 1 of Embodiment 1 in sequence of the process. In each figure, (a) is a cross-sectional view of the TFT section along the line A-A in FIG. 1, and (b) is a cross-sectional view of the level-difference adjustment protrusions along the line B-B in FIG. 1. The method of manufacturing the liquid crystal display device 1 will be described below with reference to FIGS. 1 and 2 to 4.

First, as shown in FIG. 2, on the transparent substrate 10 that is glass or the like, a silicon oxide film with a thickness of 100 to 300 nm is formed as a first interlayer insulating film 15. Next, on the first interlayer insulating film 15, a polycrystalline silicon film is formed with a thickness of 30 to 150 nm. This polycrystalline silicon film is etched in island shapes by dry etching or the like, thereby forming the active layer 11 (FIG. 2a) of the TFT 3 and the level-difference adjustment protrusions 12 (FIG. 2b) in respective prescribed regions.

The level-difference adjustment protrusions 12 are formed in areas where the upper-layer wiring lines 18 formed above tend to be short-circuited due to etching residue. More specifically, as shown in FIG. 1, the level-difference adjustment protrusions 12 are formed on both sides of the gate wiring line 14, which will be formed later, and between the first upper-layer wiring line 18b and the second upper-layer wiring line 18c that are formed above so as to intersect with the gate wiring line 14.

The level-difference adjustment protrusions 12 are provided only between the upper-layer wiring lines 18 that need to be prevented from being short-circuited as described above because, if the level-difference adjustment protrusions 12 are placed along the entire gate wiring line 14, parasitic capacitance formed between the level-difference adjustment protrusions 12 and the gate wiring line 14 becomes large, which causes a signal delay.

It is preferable that the height of the level-difference adjustment protrusions 12 be lower than the height of the gate wiring line 14 so as to form intermediate steps that have a height smaller than that of the gate wiring line 14. It is more preferable that the height of the level-difference adjustment protrusions 12 be about a half of the height of the gate wiring line 14. The height of the level-difference adjustment protrusions 12 can be adjusted in accordance with the film thickness of the active layer 11 and the etching depth on the surface of the first interlayer insulating film 15.

Next, a second interlayer insulating film 16 such as a silicon oxide film covering the active layer 11 and the level-difference adjustment protrusions 12 is formed with a thickness of 50 to 200 nm. Thereafter, on the second interlayer insulating film 16, a first conductive material film made of Cr, Mo, Al, or the like is formed with a thickness of 200 to 600 nm. This first conductive material film is patterned, thereby forming the gate electrodes 13 and the gate wiring lines 14.

As shown in FIG. 2(a), the gate electrode 13 is arranged so as to be disposed over the active layer 11 of the TFT 3. Using this gate electrode 13 as a mask, an impurity such as phosphorus or boron is doped in the active layer 11 to form the source and drain of the active layer 11.

The gate electrode 13 is connected to the gate wiring line 14, and as shown in FIG. 2(b), part of the gate wiring line 14 is disposed between the pair of the level-difference adjustment protrusions 12, which were already formed.

Next, the third interlayer insulating film 17 such as a silicon oxide film covering the gate electrodes 13 and the gate wiring lines 14 is formed with a thickness of 300 to 600 nm. For the method of forming the third interlayer insulating film 17, sputtering or P-CVD method may be employed.

On the third interlayer insulating film 17, steps that correspond to the respective heights of the gate electrodes 13, the gate wiring lines 14, and the level-difference adjustment protrusions 12 are formed. In areas where the level-difference adjustment protrusions 12 are not formed, large steps that directly correspond to the height of the gate wiring lines 14 are formed above the gate wiring lines 14, while in areas where the level-difference adjustment protrusions 12 are formed adjacent to the gate wiring lines 14, as shown in FIG. 2(b), steps h2 made by the level-difference adjustment protrusions 12 are formed next to a step h1 made by the gate wiring line 14. This way, staircase-like steps having two different levels are formed.

As described above, the level-difference adjustment protrusions 12 are formed on both sides of the gate wiring line 14 adjacent to, but not overlapping the gate wiring line 14, thereby forming the two-level staircase-like steps on the interlayer insulating film 17. As a result, a level difference between respective steps becomes smaller, which reduces occurrence of etching residue formed at the level difference section. Further, the height of the level-difference adjustment protrusions 12 is about a half of the height of the gate wiring line 14, which makes the respective heights of the steps h1 and h2 equal to each other. This way, it is possible to prevent the etching residue from being formed as a result of one of the steps being larger than the other.

Next, as shown in FIG. 1, the contact holes 17a that expose the source and drain regions in the active layer 11 and the contact hole 17b that exposes part of the gate wiring line 14 are formed in the third interlayer insulating film 17.

Next, as shown in FIGS. 3(a) and 3(b), on an entire surface of the substrate, a second conductive material film 18 made of Al or the like is formed with a thickness of 400 to 600 nm. For the method of forming the second conductive material film 18, sputtering or P-CVD method may be employed. The second conductive material film 18 is electrically connected to the source and drain in the active layer 11 of the TFT through the contact holes 17a, and is connected to the gate wiring line 14 through the contact hole 17b.

The second conductive material film 18 is formed following the profile of the steps on the interlayer insulating film 17. As described above, in the areas where the level-difference adjustment protrusions 12 are formed, the staircase-like smaller steps are formed on the interlayer insulating film 17. Therefore, the conductive material film 18 can be prevented from being formed thick as a result of a level difference, thereby reducing an occurrence of the etching residue.

Next, as shown in FIG. 3(a), a resist film is formed on the second conductive material film 18, and exposure and development processes are conducted such that a resist film 20 is left only in areas where the upper-layer wiring lines 18a to 18f are to be formed. At this time, as shown in FIG. 3(b), in the areas where the level-difference adjustment protrusions 12 are formed, small, staircase-like steps corresponding to the steps on the interlayer insulating film 17 are formed on the conductive material film 18, and therefore, residue of the resist film 20 is prevented from being left on the respective steps.

Next, using the resist film 20 as a mask, the second conductive material film 18 is patterned by wet etching or dry etching, and as shown in FIG. 4(a), the upper-layer wiring lines 18a to 18f are formed. Of the upper-layer wiring lines 18a to 18f, the first upper-layer wiring line 18b and the second upper-layer wiring line 18c are arranged so as to intersect with the gate wiring line 14, and between the first upper-layer wiring line 18b and the second upper-layer wiring line 18c, the level-difference adjustment protrusions 12 are formed as shown in FIG. 1.

As described above, in the areas where the level-difference adjustment protrusions 12 are formed, the smaller, staircase-like steps are formed on the interlayer insulating film 17. This way, the conductive material film 18 is prevented from being formed thick at the level difference section, and residue of the resist film 20 is prevented from being left. Therefore, as shown in FIG. 4(b), it becomes possible to prevent etching residue of the conductive material film 18 being left at the level difference section. As a result, the first upper-layer wiring line 18b and the second upper-layer wiring line 18c arranged so as to intersect with the gate wiring line 14, i.e., the lower-layer wiring line, are not short-circuited through the etching residue, and therefore, the manufacturing yield of the semiconductor device can be improved.

In the above example of the level-difference adjustment protrusions 12, the level-difference adjustment protrusions 12 are formed using the active layer 11 disposed between the substrate and the lower-layer wiring. Alternatively, the level-difference adjustment protrusions 12 may be formed using a different interlayer film such as an insulating film or a conductive material film disposed between the substrate and the lower-layer wiring. This way, the level-difference adjustment protrusions 12 can be formed without increasing a number of process steps in manufacturing the semiconductor device, which is particularly suitable for a multilayer wiring structure that is to be formed simultaneously with the top-gate TFTs.

Embodiment 2

Figure 5:
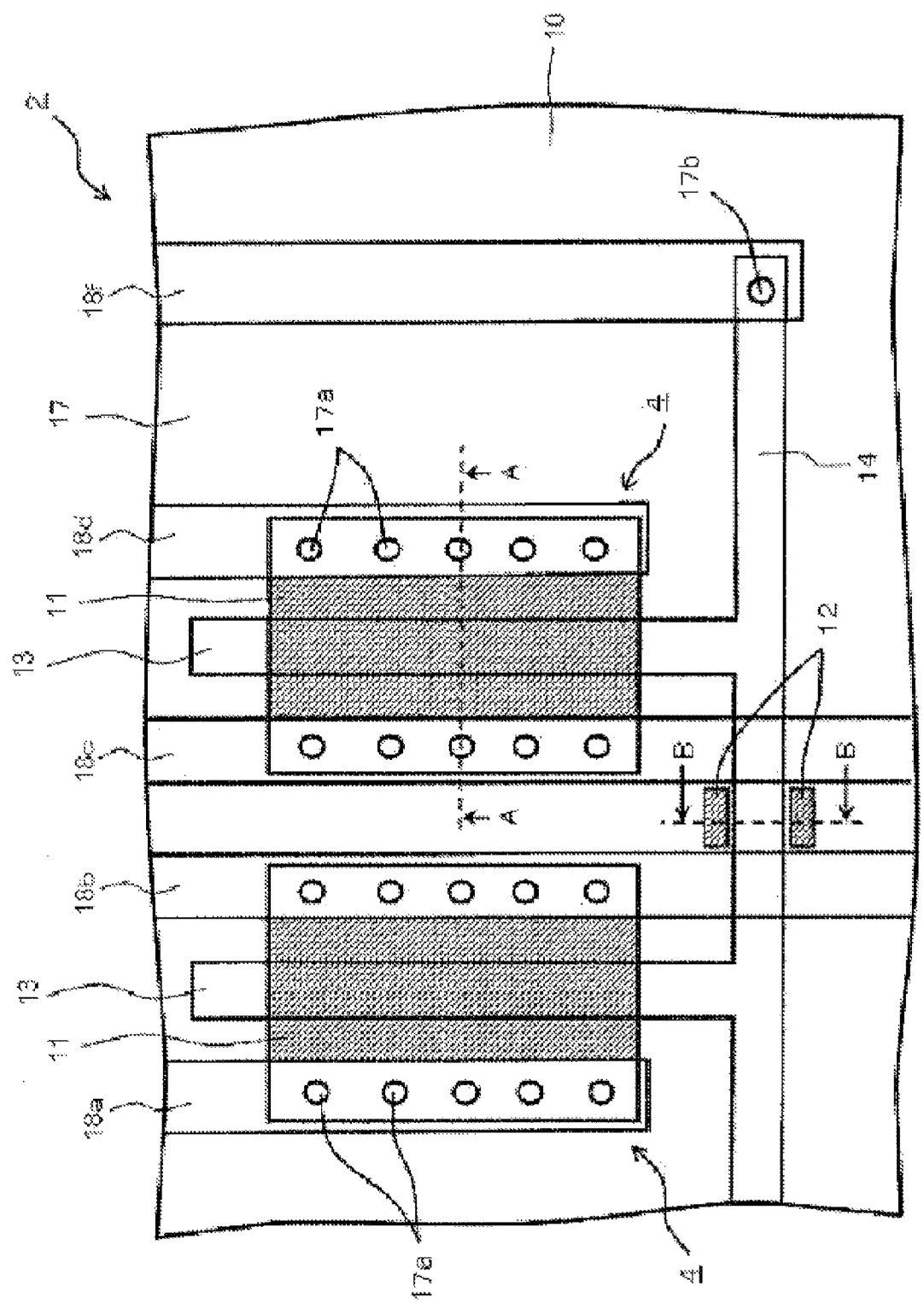
FIG. 5 is a plan view showing a second semiconductor device of the present invention.

FIG. 5 is a top view showing part of a driver circuit in a liquid crystal display device 2 of Embodiment 2. Embodiment 2 differs from Embodiment 1 in that bottom-gate TFTs 4 are formed in the driver circuit. Other configurations are the same as those of Embodiment 1, and therefore, a detailed description thereof will not be repeated.

As shown in FIG. 5, the bottom-gate TFTs 4 in which gate electrodes 13 are arranged below the respective active layers 11 are formed in the driver circuit of the liquid crystal display device 2. Other configurations are the same as those of Embodiment 1. Level-difference adjustment protrusions 12 are disposed on both sides of gate wiring line 14 and between first upper-layer wiring line 18b and second upper-layer wiring line 18c that are formed above the gate wiring line 14 so as to intersect therewith.

The level-difference adjustment protrusions 12 are disposed on both sides of the gate wiring line 14 adjacent to, but not overlapping the gate wiring line 14. This way, the step formed on the interlayer insulating film 17 above the gate wiring line 14 is divided into two, and each step becomes smaller. As a result, when the upper-layer wiring lines 18 are formed on the interlayer insulating film 17, etching residue is less likely to be formed at the level difference section, and therefore, it becomes possible to prevent a short circuit between the first upper-layer wiring line 18b and the second upper-layer wiring line 18c that cross over the level difference section.

In Embodiment 2, a method of forming the level-difference adjustment protrusions 12 differs from that of Embodiment 1. The level-difference adjustment protrusions 12 are formed using an interlayer film such as an insulating film, a semiconductor film, or a conductive material film disposed between the gate wiring lines 14, i.e., the lower-layer wiring lines, and the upper-layer wiring lines 18. This way, in the process of manufacturing the bottom-gate TFT 4, the level-difference adjustment protrusions 12 can be simultaneously formed with the TFT 4, and therefore, the manufacturing cost is prevented from being increased.

Figure 6:
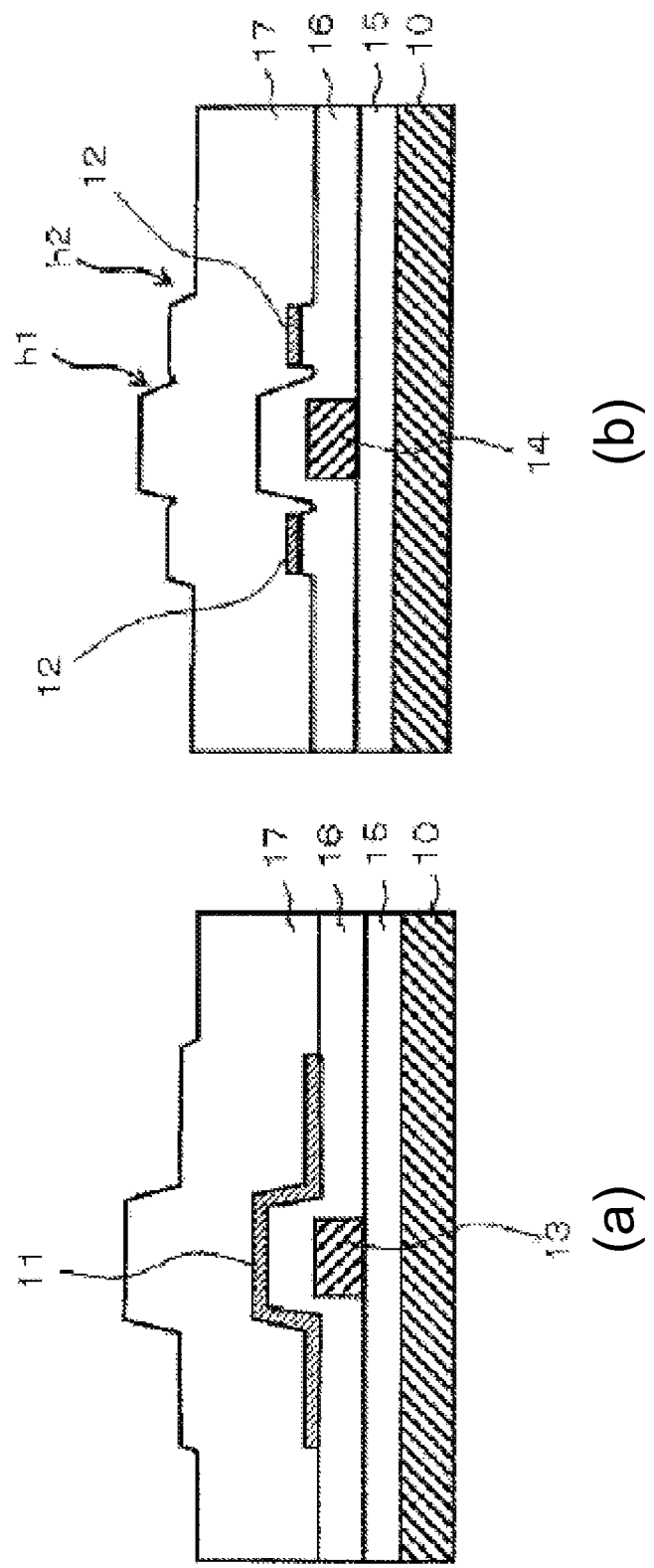
FIG. 6 is a first cross-sectional view showing a method of manufacturing the second semiconductor device.
Figure 7:
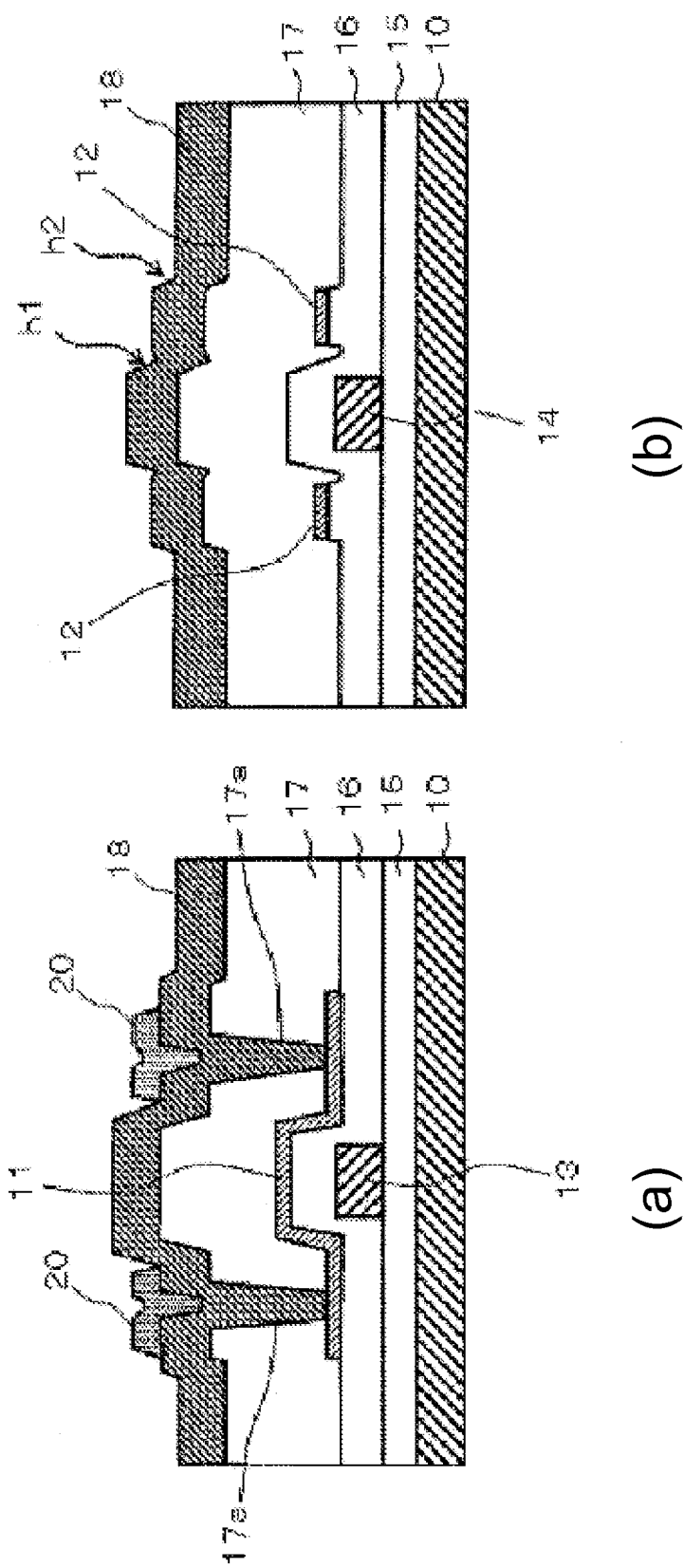
FIG. 7 is a second cross-sectional view showing the method of manufacturing the second semiconductor device.
Figure 8:
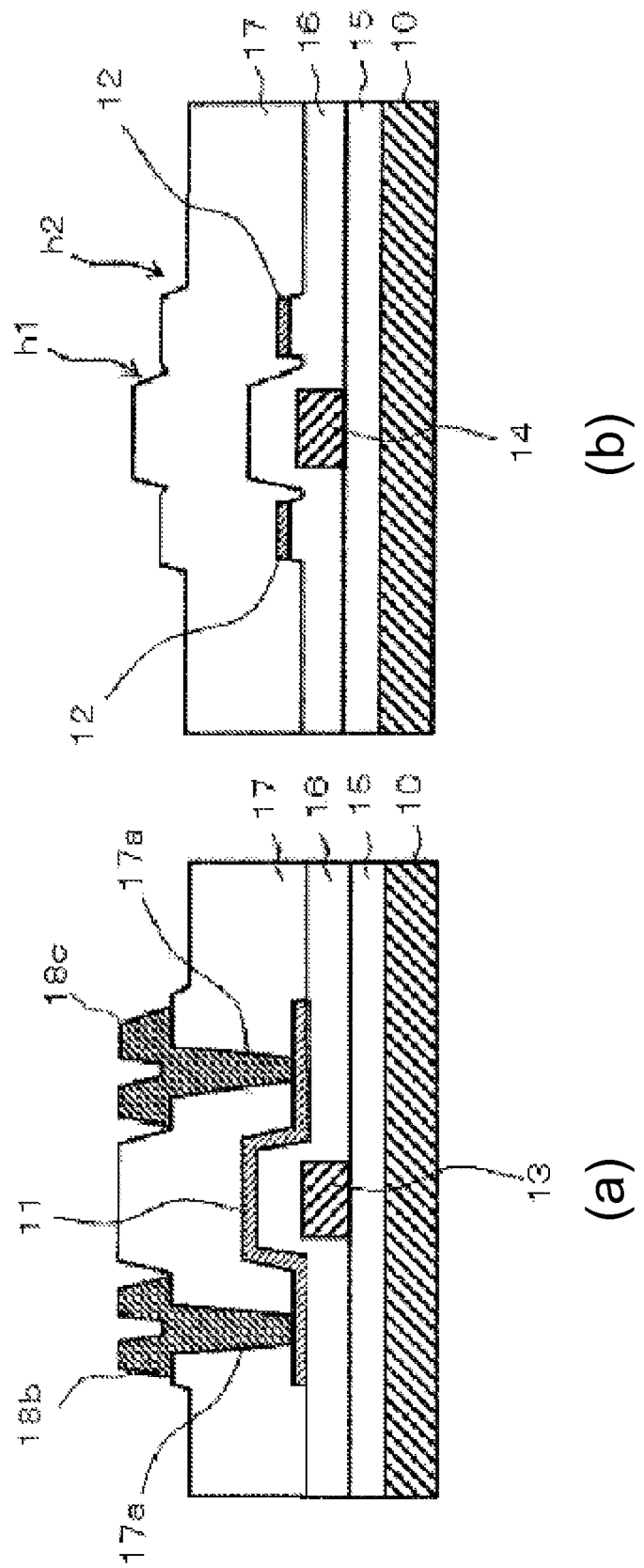
FIG. 8 is a third cross-sectional view showing the method of manufacturing the second semiconductor device.

FIGS. 6 to 8 are cross-sectional views respectively showing a method of manufacturing the liquid crystal display device of Embodiment 2 in sequence of the process. In each figure, (a) is a cross-sectional view of the TFT section along the line A-A in FIG. 5, and (b) is a cross-sectional view of the level-difference adjustment protrusions along the line B-B in FIG. 5. The method of manufacturing the liquid crystal display device 2 in Embodiment 2 will be described below with reference to FIGS. 5 and 6 to 8.

First, as shown in FIG. 6, on a transparent substrate 10 such as glass, a silicon oxide film is formed with a thickness of 100 to 300 nm as a first interlayer insulating film 15. Next, a first conductive material film made of Cr, Mo, Al, or the like is formed with a thickness of 200 to 600 nm. This first conductive material film is patterned, thereby forming the gate electrodes 13 and the gate wiring lines 14, i.e., the lower-layer wiring lines. Next, a second interlayer insulating film 16 such as a silicon oxide film covering the gate electrodes 13 and the gate wiring lines 14 is formed with a thickness of 50 to 200 nm.

Next, on the second interlayer insulating film 16, a semiconductor film made of polycrystalline silicon or the like is formed with a thickness of 30 to 150 nm. This semiconductor film is etched in island shapes by dry etching or the like, thereby forming the active layer 11 of the TFT 4 that crosses over the gate electrode 13 shown in FIG. 6(a), and the level-difference adjustment protrusions 12 shown in FIG. 6(b).

The level-difference adjustment protrusions 12 are formed in areas where the upper-layer wiring lines 18 formed above tend to be short-circuited due to etching residue. More specifically, as shown in FIG. 5, the level-difference adjustment protrusions 12 are formed at both sides of the gate wiring line 14, which was already formed, and between the first upper-layer wiring line 18b and the second upper-layer wiring line 18c that will be formed above later so as to intersect with the gate wiring line 14.

The level-difference adjustment protrusions 12 are provided only between the upper-layer wiring lines 18 that need to be prevented from being short-circuited as described above because, if the level-difference adjustment protrusions 12 are placed along the entire gate wiring line 14, parasitic capacitance formed between the level-difference adjustment protrusions 12 and the gate wiring line 14 becomes large, which causes a signal delay.

It is preferable that the height of the level-difference adjustment protrusions 12 be lower than the height of the gate wiring line 14 so as to be formed as intermediate steps that are lower than the gate wiring line 14. It is more preferable that the height of the level-difference adjustment protrusions 12 be about a half of the height of the gate wiring line 14. The height of the level-difference adjustment protrusions 12 can be adjusted in accordance with the film thickness of the active layer 11 and the etching depth on the surface of the interlayer insulating film 16.

Next, a third interlayer insulating film 17 such as a silicon oxide film covering the active layer 11 and the level-difference adjustment protrusions 12 is formed with a thickness of 300 to 600 nm. For the method of forming the third interlayer insulating film 17, sputtering or P-CVD method may be employed.

On the third interlayer insulating film 17, steps that correspond to the respective heights of the gate electrodes 13, the gate wiring lines 14, and the level-difference adjustment protrusions 12 are formed. In areas where the level-difference adjustment protrusions 12 are not formed, large steps that directly correspond to the height of the gate wiring lines 14 are formed above the gate wiring lines 14, while in areas where the level-difference adjustment protrusions 12 are formed adjacent to the gate wiring lines 14, as shown in FIG. 6(b), steps h2 made by the level-difference adjustment protrusions 12 are formed next to a step h1 made by the gate wiring line 14. This way, staircase-like steps having two different levels are formed.

As described above, the level-difference adjustment protrusions 12 are formed on both sides of the gate wiring line 14 adjacent to, but not overlapping the gate wiring line 14, thereby forming the two-level staircase-like steps on the interlayer insulating film 17. As a result, the level difference becomes smaller, which reduces the occurrence of etching residue formed at the level difference section. Further, the height of the level-difference adjustment protrusions 12 is about a half of the height of the gate wiring line 14, which makes the respective heights of the steps h1 and h2 equal to each other. This way, it is possible to prevent the etching residue from being formed as a result of one of the steps being larger than the other.

Next, as shown in FIG. 5, contact holes 17a that expose part of the source and drain of the active layer 11 and the contact hole 17b that exposes part of the gate wiring line 14 are formed in the third interlayer insulating film 17.

Next, as shown in FIGS. 7(a) and 7(b), on an entire surface of the substrate, a second conductive material film 18 made of Al or the like is formed with a thickness of 400 to 600 nm. For the method of forming the second conductive material film 18, sputtering or P-CVD method may be employed. The second conductive material film 18 is electrically connected to the source and drain in the active layer 11 of the TFT through the contact holes 17a, and is connected to the gate wiring line 14 through the contact hole 17b.

The second conductive material film 18 is formed following the profile of the steps on the interlayer insulating film 17. As described above, in the areas where the level-difference adjustment protrusions 12 are formed, the smaller, staircase-like steps are formed on the interlayer insulating film 17. Therefore, the conductive material film 18 can be prevented from being formed thick at the level difference section, thereby reducing the occurrence of etching residue.

Next, as shown in FIG. 7(a), a resist film 20 is formed on the second conductive material film 18, and exposure and development processes are conducted such that the resist film 20 is left only in areas where the upper-layer wiring lines 18a to 18f are to be formed. At this time, as shown in FIG. 7(b), in the areas where the level-difference adjustment protrusions 12 are formed, small, staircase-like steps are formed on the conductive material film 18. Therefore, residue of the resist film 20 is prevented from being left on each step.

Next, as shown in FIG. 8(a), the second conductive material film 18 is patterned by wet etching or dry etching using the resist film 20 as a mask, thereby forming the upper-layer wiring lines 18a to 18f. Of the upper-layer wiring lines 18a to 18f, the first upper-layer wiring line 18b and the second upper-layer wiring line 18c are arranged so as to intersect with the gate wiring line 14, and between the first upper-layer wiring line 18b and the second upper-layer wiring line 18c, the level-difference adjustment protrusions 12 are disposed.

As shown in FIG. 8(b), in the areas where the level-difference adjustment protrusions 12 are formed, the smaller, staircase-like steps are formed on the interlayer insulating film 17. This way, the conductive material film 18 is prevented from being formed thick at the level difference section, and residue of the resist film 20 is prevented from being left. Therefore, it becomes possible to prevent an occurrence of etching residue of the conductive material film 18. As a result, the first upper-layer wiring line 18b and the second upper-layer wiring line 18c arranged so as to intersect with the gate wiring line 14, i.e., the lower-layer wiring line, are not short-circuited through the etching reside, and therefore, the manufacturing yield of the semiconductor device can be improved.

In the above example of the level-difference adjustment protrusions 12, the level-difference adjustment protrusions 12 are formed using the semiconductor film disposed between the lower-layer wiring and the upper-layer wiring. Alternatively, the level-difference adjustment protrusions 12 may be formed using a different interlayer film such as an insulating film or a conductive material film disposed between the lower-layer wiring and the upper-layer wiring. This way, the level-difference adjustment protrusions 12 can be formed without increasing a number of process steps in manufacturing the semiconductor device, which is particularly suitable for a multilayer wiring structure that is to be formed simultaneously with the bottom-gate TFTs.

Embodiment 3

Figure 9:
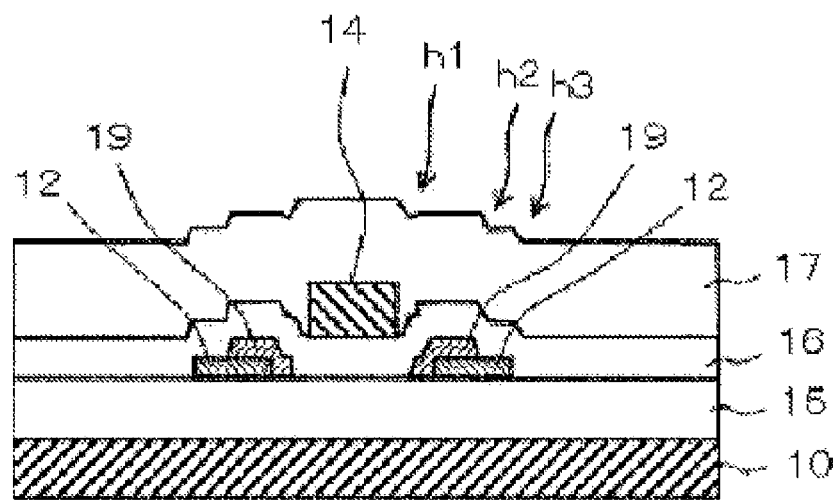
FIG. 9 is a cross-sectional view showing a level-difference adjustment protrusion in a modification example.
Figure 10:
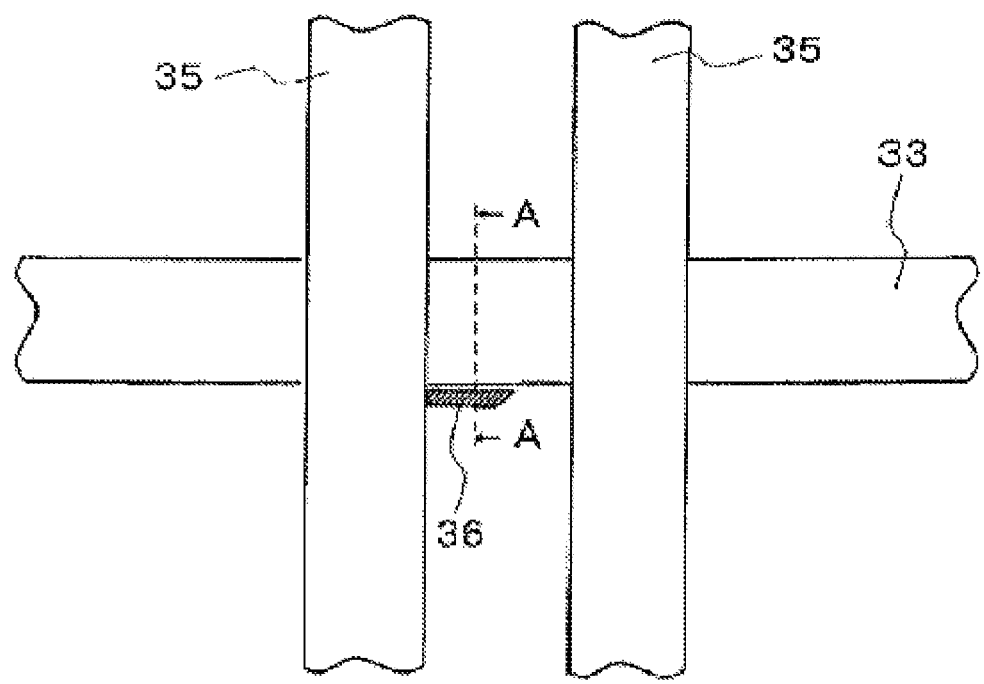
FIG. 10 is a plan view showing a conventional multilayer wiring structure.
Figure 11:
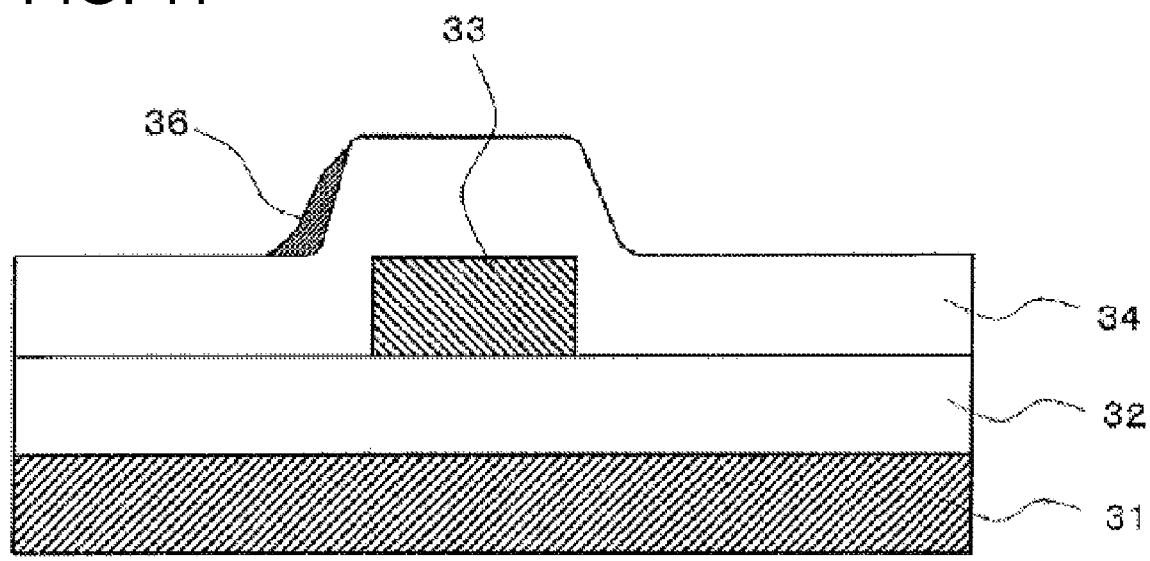
FIG. 11 is a cross-sectional view along the line A-A in FIG. 10.
Figure 12:
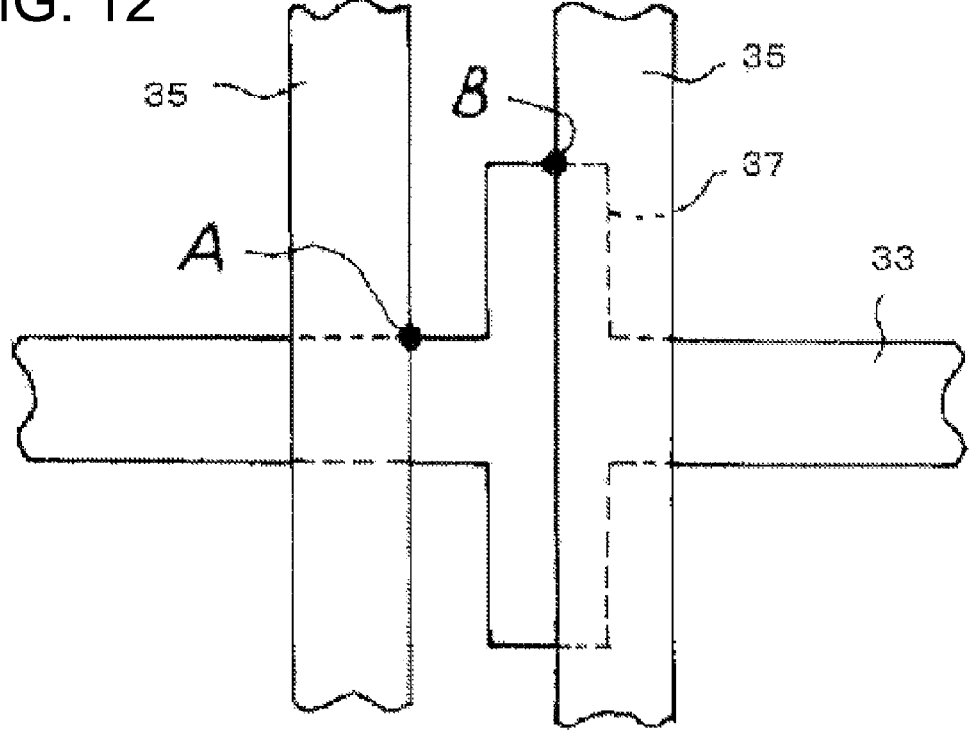
FIG. 12 is a plan view showing another conventional multilayer wiring structure.

FIG. 9 is a cross-sectional view showing the level-difference adjustment protrusions 12 in a modification example, which is Embodiment 3. In Embodiment 3, second level-difference adjustment protrusions 19 are provided so as to overlap respective inner sides (the respective sides closer to the lower-layer wiring) of the level-difference adjustment protrusions 12 in Embodiment 1. With this structure, three-level staircase-like steps h1 to h3 that respectively correspond to the lower-layer wiring lines 14, the second level-difference adjustment protrusions 19, and the first level-difference adjustment protrusions 12 are formed on the interlayer insulating film 17. This way, the respective level differences can be made even smaller. Therefore, it becomes possible to prevent a short circuit caused by etching residue more reliably.

The second level-difference adjustment protrusions 19 can be formed, for example, by depositing a conductive material film made of Al or the like after forming the first level-difference adjustment protrusions 12 using the semiconductor film as described in Embodiment 1, and etching the conductive material film in island shapes so as to overlap the respective inner sides (the respective sides closer to the lower-layer wiring) of the first level-difference adjustment protrusions 12. For the method of etching, dry etching or wet etching, in which the conductive material film can be selectively etched, may be employed.

It is preferable that the respective heights of the first level-difference adjustment protrusions 12 and the second level-difference adjustment protrusions 19 be about one-third of the height of the lower-layer wiring 14. This way, the level difference between the respective steps in the three-level steps formed on the interlayer insulating film 17 can be made equal to each other. Therefore, it becomes possible to prevent etching residue from being formed due to one of the steps being larger than the other steps.

The modification example of the level-difference adjustment protrusions 12 described as Embodiment 3 can be applied to the liquid crystal display device 2 in Embodiment 2. Further, the first level-difference adjustment protrusions 12 can be formed of the conductive material film, and the second level-difference adjustment protrusions 19 can be formed of the semiconductor film.

INDUSTRIAL APPLICABILITY

The present invention can be applied to a liquid crystal display device provided with a driver circuit that is constituted of thin-film transistors in particular, and to the method of manufacturing the same.

DESCRIPTION OF REFERENCE CHARACTERS 1, 2 liquid crystal display device
3 top-gate TFT
4 bottom-gate TFT
10 substrate
11 semiconductor film
12 level-difference adjustment protrusion
13 gate electrode
14 gate wiring line
15 first interlayer insulating film
16 second interlayer insulating film
17 third interlayer insulating film
18 upper-layer wiring line
19 second level-difference adjustment protrusion
20 resist film
33 first wiring line
35 second wiring line
36 etching residue
37 protrusion

The invention claimed is:
1. A semiconductor device, comprising:
a lower-layer wiring line formed on a substrate; an interlayer insulating film covering the lower-layer wiring line; a first upper-layer wiring line and a second upper-layer wiring line arranged on the interlayer insulating film so as to intersect the lower-layer wiring line; and a level-difference adjustment island-disposed between the first upper-layer wiring line and the second upper-layer wiring line adjacent to a side of the lower-layer wiring line,
wherein the level-difference adjustment island includes a first level-difference adjustment island and a second level-difference adjustment island that is formed so as to overlap the first level-difference adjustment island on a side closer to the lower-layer wiring line.
2. The semiconductor device according to claim 1, wherein respective heights of the first level-difference adjustment island and the second level-difference adjustment island are about one-third of that of the lower-layer wiring line.

* * * * *